United States Patent
Harada (10) Patent No.: US 7,750,438 B2
(45) Date of Patent: Jul. 6, 2010

(54) SEMICONDUCTOR DEVICE

(75) Inventor: Tatsuo Harada, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 12/356,891

(22) Filed: Jan. 21, 2009

(65) Prior Publication Data

US 2010/0052011 A1 Mar. 4, 2010

(30) Foreign Application Priority Data

Aug. 26, 2008 (JP) .............................. 2008-216659

(51) Int. Cl.
*H01L 29/70* (2006.01)
(52) U.S. Cl. .............................. 257/592; 257/E29.027; 257/E29.066; 257/E29.197
(58) Field of Classification Search ................ 257/197, 257/205, 362, 565, 591, 592, E29.027, E29.066, 257/E29.197, E21.382; 438/133
See application file for complete search history.

(56) References Cited

U.S. PATENT DOCUMENTS 5,631,483 A * 5/1997 Ferla et al. .................. 257/341

FOREIGN PATENT DOCUMENTS

| JP | 10-50724 | 2/1998 |
|---|---|---|
| JP | 2001-332729 | 11/2001 |
| JP | 2003-338626 | 11/2003 |
| JP | 2004-103982 | 4/2004 |
| JP | 2004-311481 | 11/2004 |
| JP | 2007-19518 | 1/2007 |

* cited by examiner

*Primary Examiner*—Quoc D Hoang
(74) *Attorney, Agent, or Firm*—Oblon, Spivak, McClelland, Maier & Neustadt, L.L.P.

(57) ABSTRACT

An n-type buffer region 6 is arranged between an n⁻ drift region 1 and a p-type collector region 7, and has a higher impurity concentration than n⁻ drift region 1 Assuming that α represents the ratio (WTA/WTB) between WTA expressed as:

$$WTA = \sqrt{\frac{2\varepsilon_s \varepsilon_0 V}{qNd}}$$

and the thickness WTB of the drift region held between the base region and the buffer region, the ratio ($D_C/D_B$) of the net dose $D_C$ of the collector region with respect to the net dose $D_B$ of the buffer region is at least α. Thus, a semiconductor device capable of ensuring a proper margin of SCSOA resistance can be obtained.

2 Claims, 10 Drawing Sheets

IMPURITY CONTENT RATIO $(D_C/D_B)=1.05, V_G=15.0V$

FIG.4

IMPURITY CONTENT RATIO $(D_C/D_B)=1.935, V_G=15.0V$

SEMICONDUCTOR DEVICE

BACKGROUND OF THE INVENTION

1. Field of the Invention

The present invention relates to a semiconductor device, and more particularly, it relates to a semiconductor device having an IGBT (Insulated Gate Bipolar Transistor).

2. Description of the Background Art

An IGBT has both of high withstand voltage/high current characteristics of a bipolar transistor and high frequency characteristics of a MOSFET (Metal Oxide Semiconductor Field-Effect Transistor). An IGBT having the so-called LPT (Light Punch Through) structure (Field-STOP structure) including a buffer region provided between a drift region and a collector region is known as such an IGBT (refer to Japanese Patent Laying-Open Nos. 2004-311481, 2001-332729, 10-050724 (1998), 2007-019518, 2004-103982 and 2003-338626).

However, conventional IGBTs having the LPT structure include such an IGBT that the resistance of a safe operating area upon cutoff of a short-circuit current, i.e., the so-called SCSOA (Short Circuit Safe Operation Area) tends to be low and such an IGBT that the margin of the SCSOA resistance tends to be excessive, and it is difficult to ensure a proper margin.

SUMMARY OF THE INVENTION

The present invention has been proposed in consideration of the aforementioned problems, and an object thereof is to provide a semiconductor device capable of ensuring a proper margin of SCSOA resistance.

A semiconductor device according to an aspect of the present invention comprises a first conductivity type drift region, a first conductivity type emitter region, a second conductivity type base region, a gate electrode layer, a second conductivity type collector region and a first conductivity type buffer region. The emitter region is formed on one side of the drift region. The base region is arranged between the drift region and the emitter region. The gate electrode layer is so arranged as to be electrically isolated from and opposed to the base region held between the drift region and the emitter region. The collector region is formed on another side of the drift region. The buffer region is arranged between the drift region and the collector region, and has a higher impurity concentration than the drift region.

Assuming that α represents the ratio (WTA/WTB) between WTA expressed as:

$$WTA = \sqrt{\frac{2\varepsilon_s \varepsilon_0 V}{qNd}}$$

(where $\varepsilon_s$ represents the dielectric constant of silicon, $\varepsilon_0$ represents the dielectric constant of a vacuum, $q$ represents the charge quantity of electrons, Nd represents the impurity concentration of the drift region and V represents the avalanche voltage) and the thickness WTB of the drift region held between the base region and the buffer region, the ratio ($D_C/D_B$) of the net dose $D_C$ of the collector region with respect to the net dose $D_B$ of the buffer region is at least α.

In the semiconductor device according to this aspect of the present invention, the ratio ($D_C/D_B$) of the net dose $D_C$ of the collector region with respect to the net dose $D_B$ of the buffer region is so set to at least α that a proper margin for the SCSOA resistance can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

Figure 1:
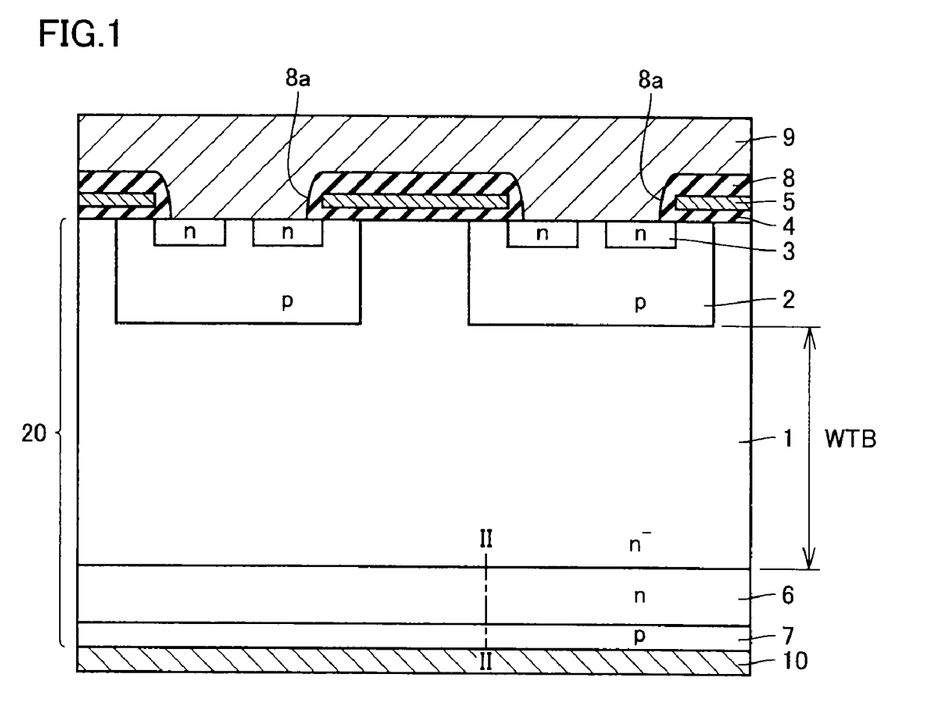
FIG. 1 is a sectional view schematically showing the structure of a semiconductor device according to an embodiment of the present invention.

Referring to FIG. 1, a semiconductor device according to this embodiment has IGBTs of the LPT structure. Each IGBT of the LPT structure mainly includes an n⁻ drift region 1, a p-type base region 2, an n-type emitter region 3, a gate insulating film 4, a gate electrode layer 5, an n-type buffer region 6, a p-type collector region 7, an insulating film 8, an emitter electrode layer 9 and a collector electrode layer 10.

N⁻ drift region 1, p-type base region 2, n-type emitter region 3, n-type buffer region 6 and p-type collector region 7 are formed in a semiconductor substrate 20. N-type emitter region 3 is formed on a first surface of semiconductor substrate 20 on one side of n⁻ drift region 1. P-type base region 2 is arranged between n⁻ drift region 1 and n-type emitter region 3, and constitutes p-n junctions with the respective ones of n⁻ drift region 1 and n-type emitter region 3.

Gate electrode layer 5 is so arranged as to be electrically isolated from and opposed to p-type base region 2 held between n⁻ drift region 1 and n-type emitter region 3. Gate electrode layer 5 is so arranged as to be electrically isolated from and opposed to not only p-type base region 2 but also a partial region of n⁻ drift region 1. Gate insulating film 4 is arranged between gate electrode layer 5 and semiconductor substrate 20, so that gate electrode layer 5 is electrically isolated from and opposed to the respective ones of p-type base region 2 and n⁻ drift region 1.

P-type collector region 7 is formed on a second surface of semiconductor substrate 20 on another side of n⁻ drift region 1. N-type buffer region 6 is arranged between n⁻ drift region 1 and p-type collector region 7, and has a higher n-type impurity concentration than n⁻ drift region 1. N-type buffer region 6 is bonded to n⁻ drift region 1, and forms a p-n junction with p-type collector region 7.

Insulating film 8 is formed on the first surface of semiconductor substrate 20 to cover the upper surface and the side surfaces of gate electrode layer 5. Insulating film 8 has an opening 8a reaching a part of the first surface of semiconductor substrate 20. Emitter electrode layer 9 is formed on insulating film 8. Emitter electrode layer 9 is electrically connected with both of n-type emitter region 3 and p-type base region 2 through opening 8a of insulating film 8.

Collector electrode layer 10 is formed on the second surface of semiconductor substrate 20, to be electrically connected with p-type collector region 7.

The impurity concentrations of n⁻ drift region 1, n-type buffer region 6 and p-type collector region 7 in the semiconductor device according to this embodiment are now described.

Figure 2:
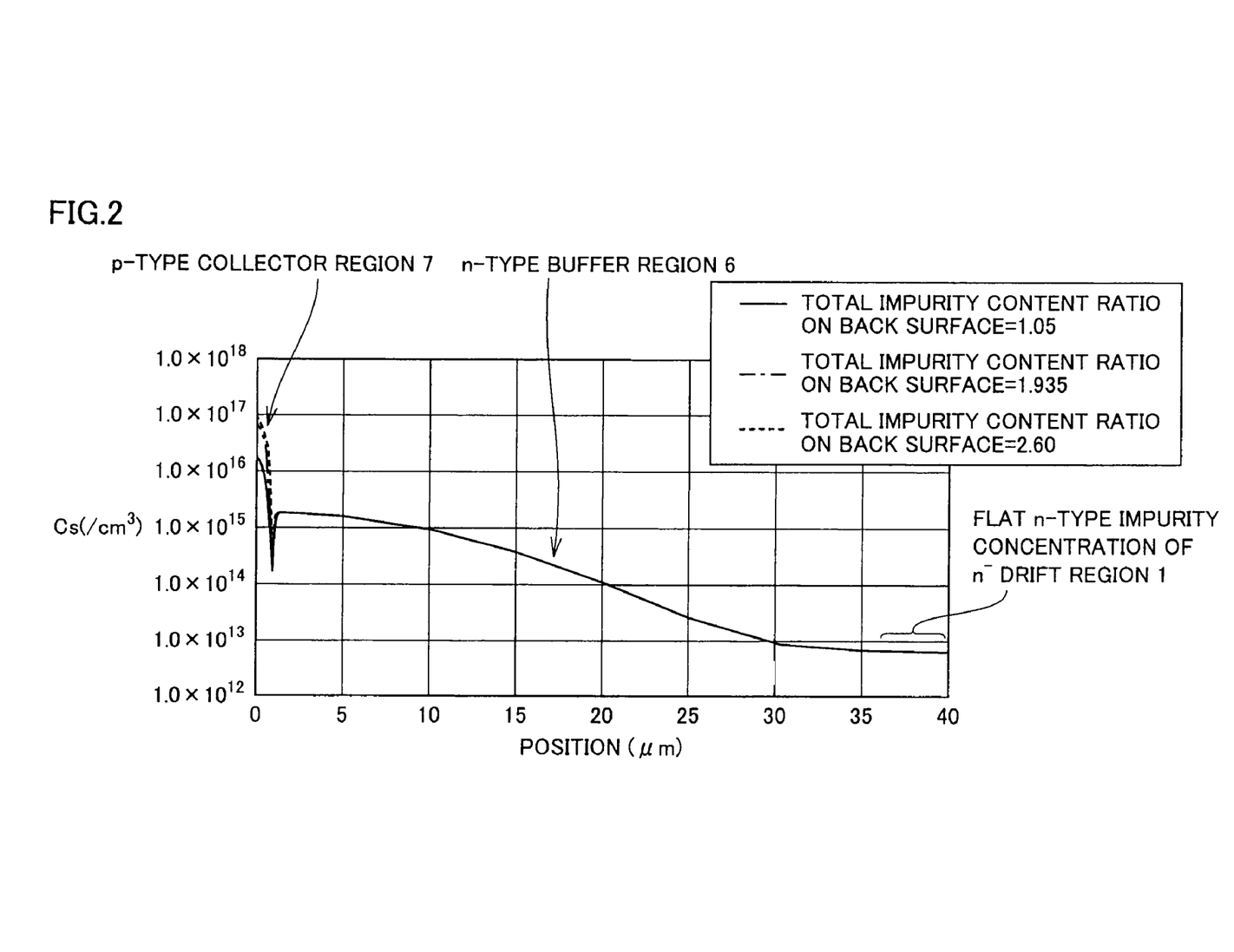
FIG. 2 illustrates the impurity concentration distribution in a portion along the line II-II in FIG. 1.

Referring to FIG. 2, n⁻ drift region 1 and n-type buffer region 6 are doped with phosphorus (P), for example, as an n-type impurity. P-type collector region 7 is doped with boron (B), for example, as a p-type impurity.

N⁻ drift region 1 has a substantially flat (homogeneous) n-type impurity concentration, as shown on the right end in FIG. 2. The n-type impurity concentration of n⁻ drift region 1 is $7.2 \times 10^{12}$ cm⁻³, for example. N-type buffer region 6 has a higher n-type impurity concentration than n⁻ drift region 1, and has such a concentration distribution that the n-type impurity concentration thereof is gradually increased from the side of n⁻ drift region 1 toward the side of p-type collector region 7. The peak concentration of n-type buffer region 6 is $2.0 \times 10^{15}$ cm⁻³, for example.

P-type collector region 7 has the maximum p-type impurity concentration in the vicinity of the second surface of semiconductor substrate 20, and has such a concentration distribution that the p-type impurity concentration thereof is gradually reduced from the side of the second surface toward the side of n-type buffer region 6. The peak concentration of p-type collector region 7 is $1.0 \times 10^{17}$ cm⁻³, for example.

According to this embodiment, the ratio ($D_C/D_B$) of the net dose $D_C$ of p-type collector region 7 with respect to the net dose $D_B$ of n-type buffer region 6 is at least α.

The net dose $D_B$ of n-type buffer region 6 corresponds to the total impurity content (unit: number/cm²) of the n-type impurity (phosphorus, for example) forming n-type buffer region 6, while the net dose $D_C$ of p-type collector region 7 corresponds to the total impurity content (unit: number/cm²) of the p-type impurity (boron, for example) forming p-type collector region 7.

α represents the ratio (WTA/WTB) between WTA expressed in the following equation (1) and the thickness WTB (see FIG. 1) of n⁻ drift region 1 held between p-type base region 2 and n-type buffer region 6:

$$WTA = \sqrt{\frac{2\varepsilon_s \varepsilon_0 V}{qNd}} \quad (1)$$

In the above equation (1), $\varepsilon_S$ represents the dielectric constant of silicon, $\varepsilon_0$ represents the dielectric constant of a vacuum, q represents the charge quantity of electrons, Nd represents the impurity concentration (unit: cm⁻³) of n⁻ drift region 1, and V represents the avalanche voltage of the IGBT.

The thickness WTB corresponds to the distance between the p-n junction interface between p-type base region 2 and n-type buffer region 6 and the position of a concentration higher by 10% than the flat n-type impurity concentration of n⁻ drift region 1 shown in FIG. 2.

According to this embodiment, the net dose $D_B$ of n-type buffer region 6 is preferably at least a value obtained by multiplying the net dose $D_D$ of n⁻ drift region 1 by α.

The contents examined by the inventor in relation to the semiconductor device according to this embodiment are now described.

First, the inventor has examined changes in margins of SCSOA resistance upon changes of the aforementioned impurity content ratio ($D_C/D_B$). In this examination, the rated voltage and the avalanche voltage of the IGBT were set to 6500 V and 8000 V respectively. FIGS. 3, 4, 5A and 5B show the results of the aforementioned examination.

The value of α calculated through the aforementioned equation (1) with the avalanche voltage of 8000 V was 1.935. In this calculation, the impurity concentration of n⁻ drift region 1 was set to $7.2 \times 10^{12}$ cm⁻³. $V_{GE}$ (gate-to-emitter voltage: equal to gate voltage $V_G$) of 15 V and $V_{CE}$ (collector-to-emitter voltage) of 4500 V are generally applied to an IGBT having a rated voltage of 6500 V, and hence breakage of the IGBT was examined with reference to these conditions.

Figure 3:
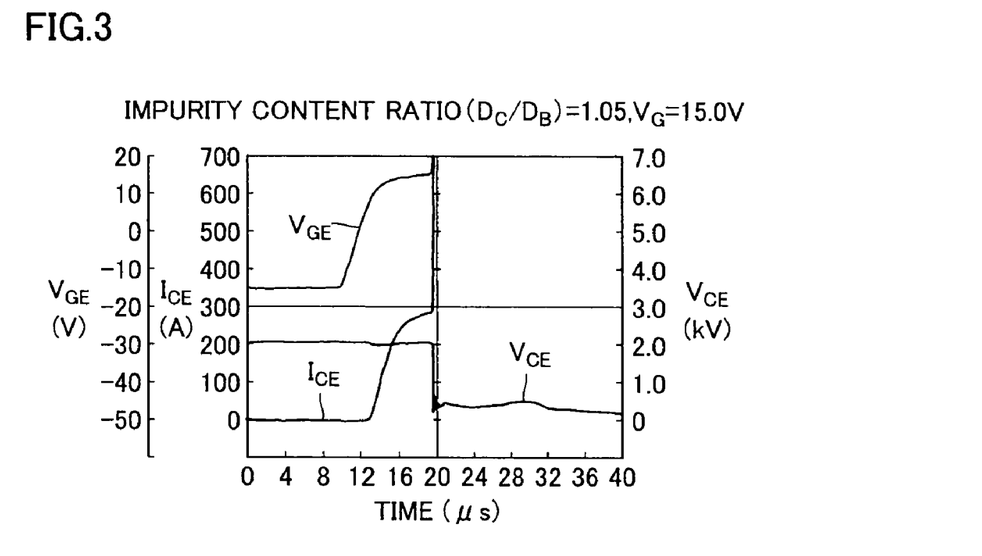
FIG. 3 shows results as to whether or not an IGBT is broken in general employment with a rated voltage of 6500 V when an impurity content ratio ($D_C/D_B$) is 1.05 and $V_{GE}$ is 15 V.

From the results shown in FIG. 3, the IGBT was broken with $V_{CE}$ of 2000 V lower than $V_{CE}$ of 4500 V when the impurity content ratio ($D_C/D_B$) was 1.05, i.e., lower than the aforementioned α, and $V_{GE}$ was set to 15 V. When an IGBT is broken, the waveform of a collector-to-emitter current ($I_{CE}$) abruptly changes in an increasing direction and the waveform of $V_{CE}$ is abruptly reduced, and hence the breakage of the IGBT can be recognized from these changes etc.

Figure 4:
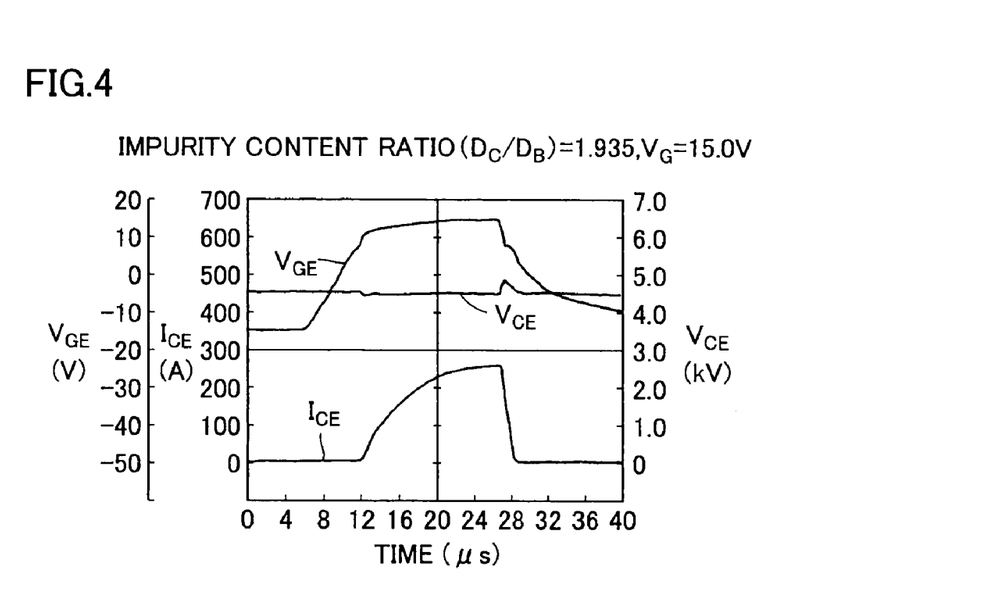
FIG. 4 shows results as to whether or not the IGBT is broken in general employment with the rated voltage of 6500 V when the impurity content ratio ($D_C/D_B$) is 1.935 and $V_{GE}$ is 15 V.

When the impurity content ratio ($D_C/D_B$) was 1.935 identically to the aforementioned α, on the other hand, the IGBT was not broken with $V_{CE}$ of 4500 V, i.e., not more than the rate voltage (6500 V), despite $V_{GE}$ of 15 V, as shown in FIG. 4. Thus, it has been recognized that the IGBT is not broken under conditions generally employed at the rated voltage of 6500 V when the impurity content ratio ($D_C/D_B$) is identical to the aforementioned α.

Figure 5A:
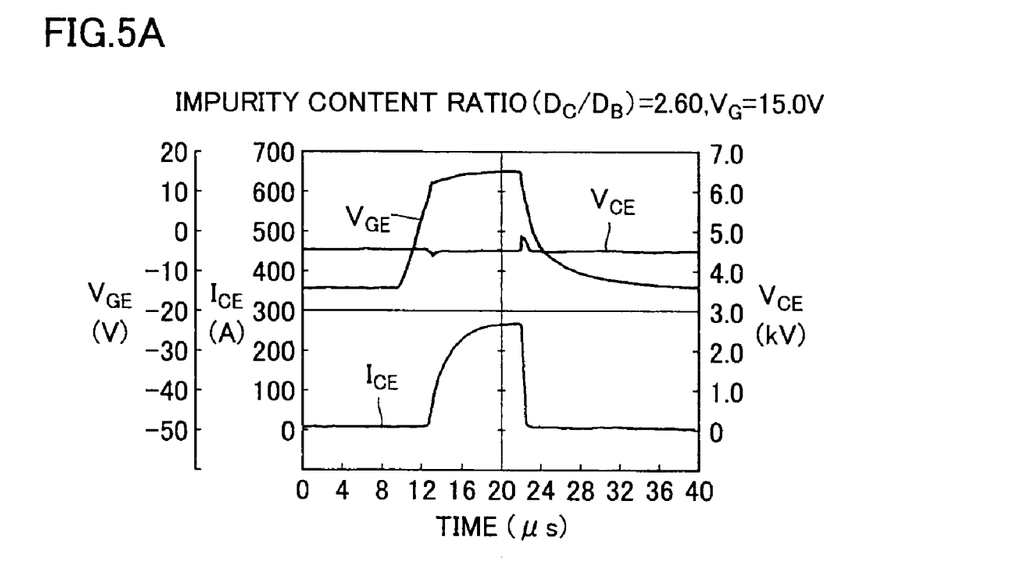
FIG. 5A shows results as to whether or not the IGBT is broken in general employment with the rated voltage of 6500 V when the impurity content ratio ($D_C/D_B$) is 2.60 and $V_{GE}$ is 15 V.

Also when the impurity content ratio ($D_C/D_B$) was 2.60 higher than the aforementioned α, the IGBT was not broken with $V_{CE}$ of 4500 V, i.e., not more than the rate voltage (6500 V), despite $V_{GE}$ of 15 V, as shown in FIG. 5A. Thus, it has been recognized that the IGBT is not broken under conditions generally employed at the rated voltage of 6500 V also when the impurity content ratio ($D_C/D_B$) is higher than the aforementioned α.

Figure 5B:
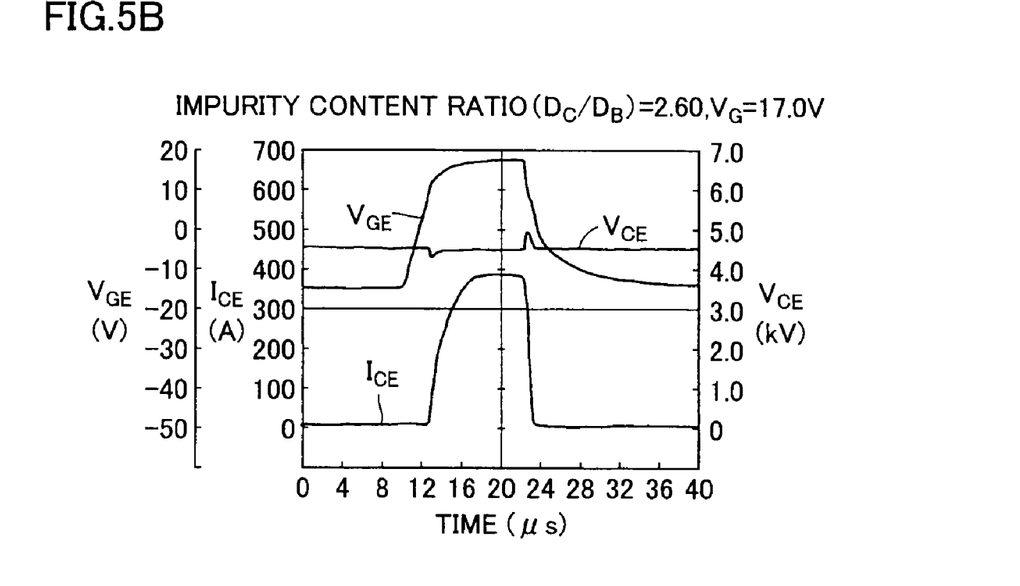
FIG. 5B shows results as to whether or not the IGBT is broken in general employment with the rated voltage of 6500 V when the impurity content ratio ($D_C/D_B$) is 2.60 and $V_{GE}$ is 17 V.

When the impurity content ratio ($D_C/D_B$) was 2.60 higher than the aforementioned α, the IGBT was not broken with $V_{CE}$ of 4500 V, i.e., not more than the rate voltage (6500 V), despite $V_{GE}$ of 17 V, as shown in FIG. 5B.

Thus, it has been recognized that the IGBT is not broken under conditions generally employed at the rated voltage of 6500 V when the impurity content ratio ($D_C/D_B$) is at least the aforementioned α.

Figure 6:
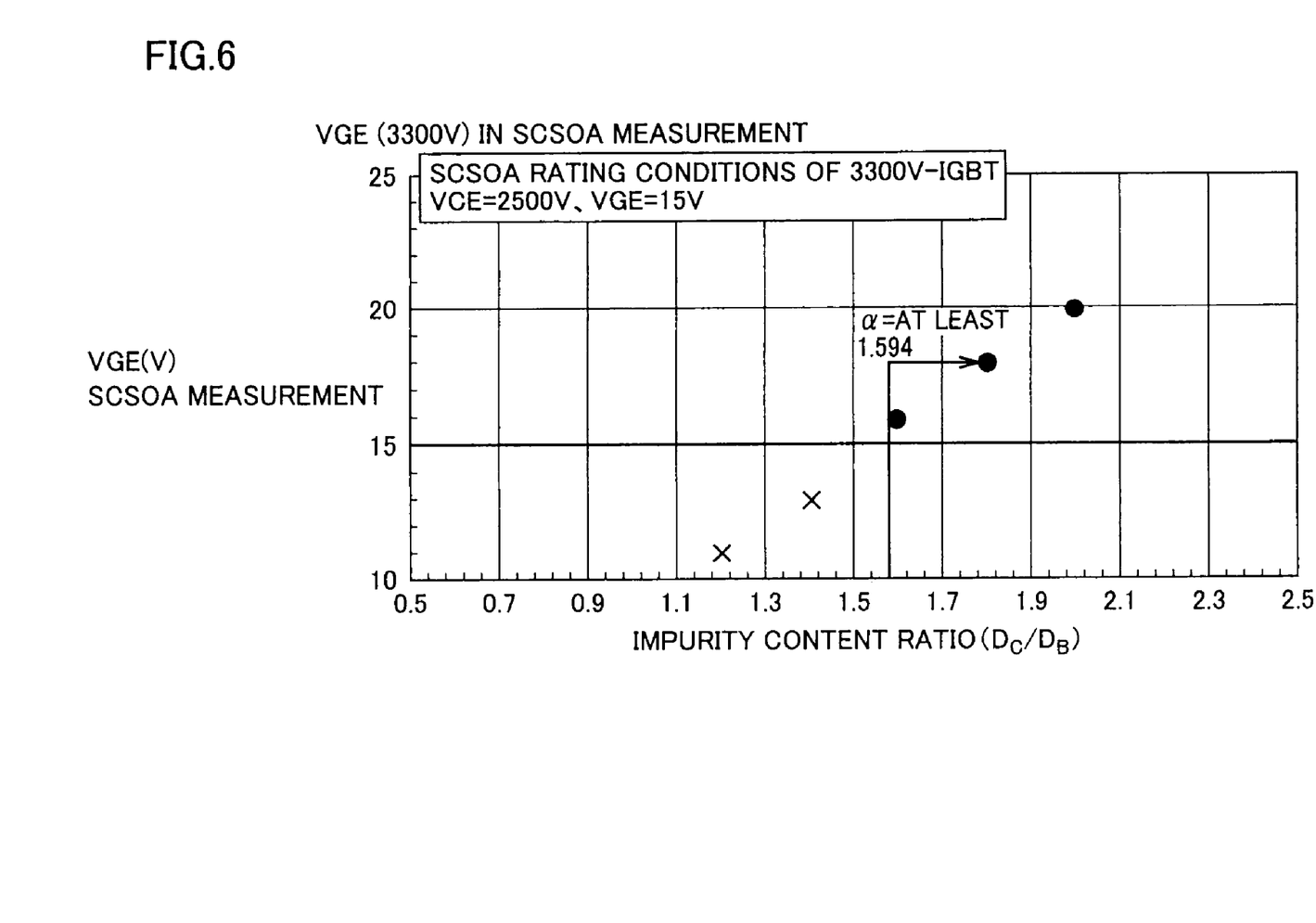
FIG. 6 shows whether or not the IGBT is broken when varying the impurity content ratio ($D_C/D_B$) and $V_{GE}$ while setting the rated voltage and the avalanche voltage of the IGBT to 3300 V and 4000 V respectively.
Figure 7:
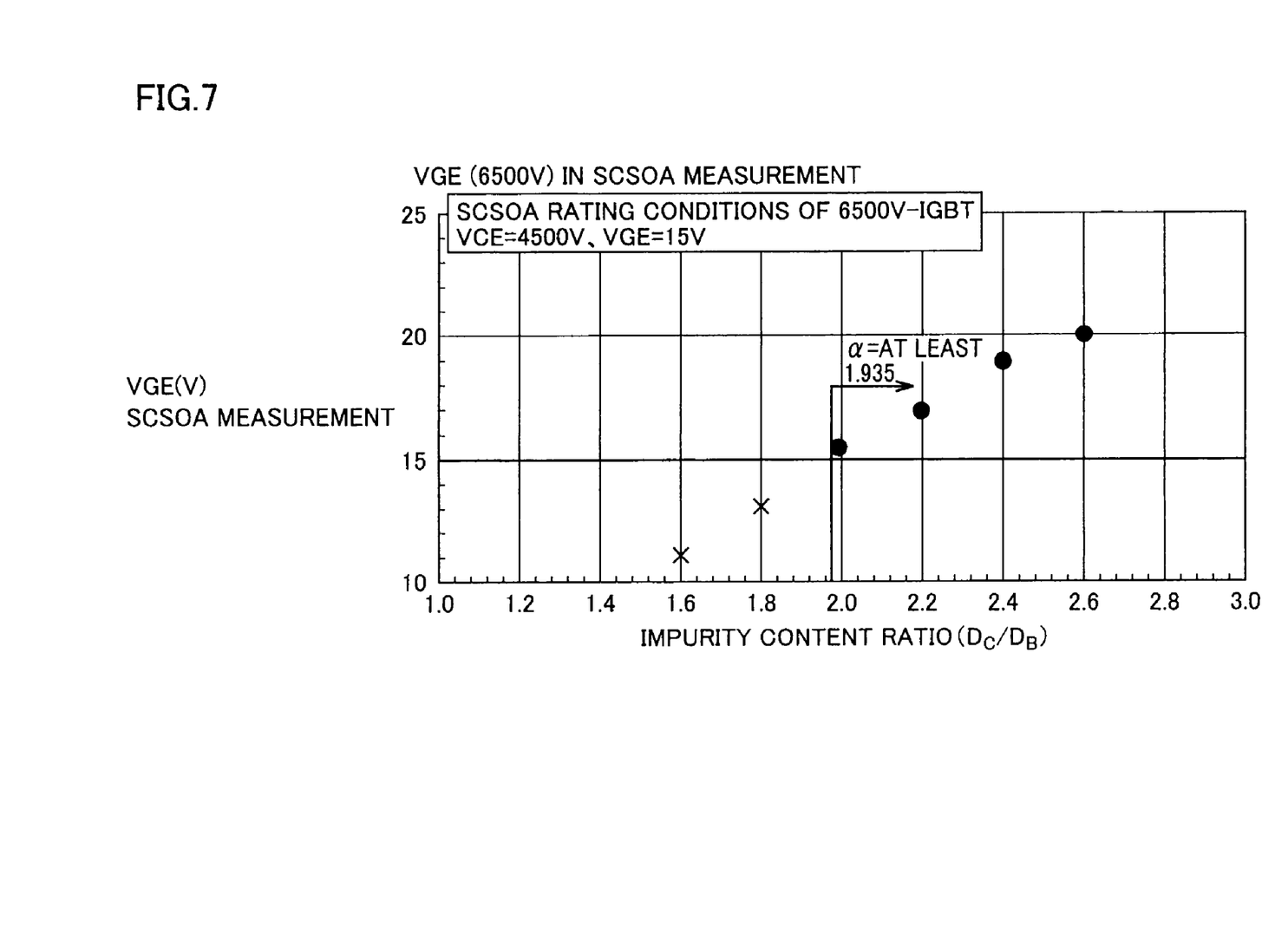
FIG. 7 shows whether or not the IGBT is broken when varying the impurity content ratio ($D_C/D_B$) and $V_{GE}$ while setting the rated voltage and the avalanche voltage of the IGBT to 6500 V and 8000 V respectively.

The inventor has also examined as to whether or not the IGBT is broken when the aforementioned impurity content ratio ($D_C/D_B$) and $V_{GE}$ were varied. FIGS. 6 and 7 show the results.

FIG. 6 shows whether or not the IGBT is broken when varying the impurity content ratio ($D_C/D_B$) and $V_{GE}$ while setting the rated voltage and the avalanche voltage of the IGBT to 3300 V and 4000 V respectively. The value of α calculated through the aforementioned equation (1) with the avalanche voltage of 4000 V was 1.594. $V_{GE}$ of 15 V and $V_{CE}$ of 2500 V are generally applied to an IGBT having a rated voltage of 3300 V, and hence breakage of the IGBT was examined with reference to these conditions.

Referring to FIG. 6, the IGBT was broken with $V_{GE}$ of 11 V when the impurity content ratio ($D_C/D_B$) was set to 1.2, and broken with $V_{GE}$ of 13 V when the impurity content ratio ($D_C/D_B$) was set to 1.4. On the other hand, the IGBT was not broken with $V_{GE}$ of less than 16 V when the impurity content ratio ($D_C/D_B$) was set to 1.6, not broken with $V_{GE}$ of less than 18 V when the impurity content ratio ($D_C/D_B$) was set to 1.8, and not broken with $V_{GE}$ of less than 20 V when the impurity content ratio ($D_C/D_B$) was set to 2.0.

From these results, it has been recognized that the IGBT is not broken under generally employed conditions ($V_{GE}$=15 V and $V_{CE}$=2500 V) at the rated voltage of 3300 V when the impurity content ratio ($D_C/D_B$) is at least the aforementioned α (=1.594).

FIG. 7 shows whether or not the IGBT is broken when varying the impurity content ratio ($D_C/D_B$) and $V_{GE}$ while setting the rated voltage and the avalanche voltage of the IGBT to 6500 V and 8000 V respectively. The value of α with the avalanche voltage of 8000 V is 1.935, identically to the above. $V_{GE}$ of 15 V and $V_{CE}$ of 4500 V are generally applied to an IGBT having a rated voltage of 6500 V, and hence breakage of the IGBT was examined with reference to these conditions.

Referring to FIG. 7, the IGBT was broken with $V_{GE}$ of 11 V when the impurity content ratio ($D_C/D_B$) was set to 1.6, and broken with $V_{GE}$ of 13 V when the impurity content ratio ($D_C/D_B$) was set to 1.8. On the other hand, the IGBT was not broken with $V_{GE}$ of less than 16 V when the impurity content ratio ($D_C/D_B$) was set to 2.0, and not broken with $V_{GE}$ of less than 17 V when the impurity content ratio ($D_C/D_B$) was set to 2.2. Further, the IGBT was not broken with $V_{GE}$ of less than 19 V when the impurity content ratio ($D_C/D_B$) was set to 2.4, and not broken with $V_{GE}$ of less than 20 V when the impurity content ratio ($D_C/D_B$) was set to 2.6.

From these results, it has been recognized that the IGBT is not broken under generally employed conditions ($V_{GE}$=15 V and $V_{CE}$=4500 V) at the rated voltage of 6500 V when the impurity content ratio ($D_C/D_B$) is at least the aforementioned α (=1.935).

From the results shown in FIGS. 6 and 7, it has been recognized that the IGBT is not broken under the conditions generally employed at each rate condition, so far as the impurity content ratio ($D_C/D_B$) is at least the aforementioned α under the corresponding rate condition.

Then, the inventor has examined changes of the withstand voltage upon changes of the net dose $D_B$ of n-type buffer region 6. In this examination, the rated voltage and the avalanche voltage of the IGBT were set to 6500 V and 8000 V respectively.

Figure 8:
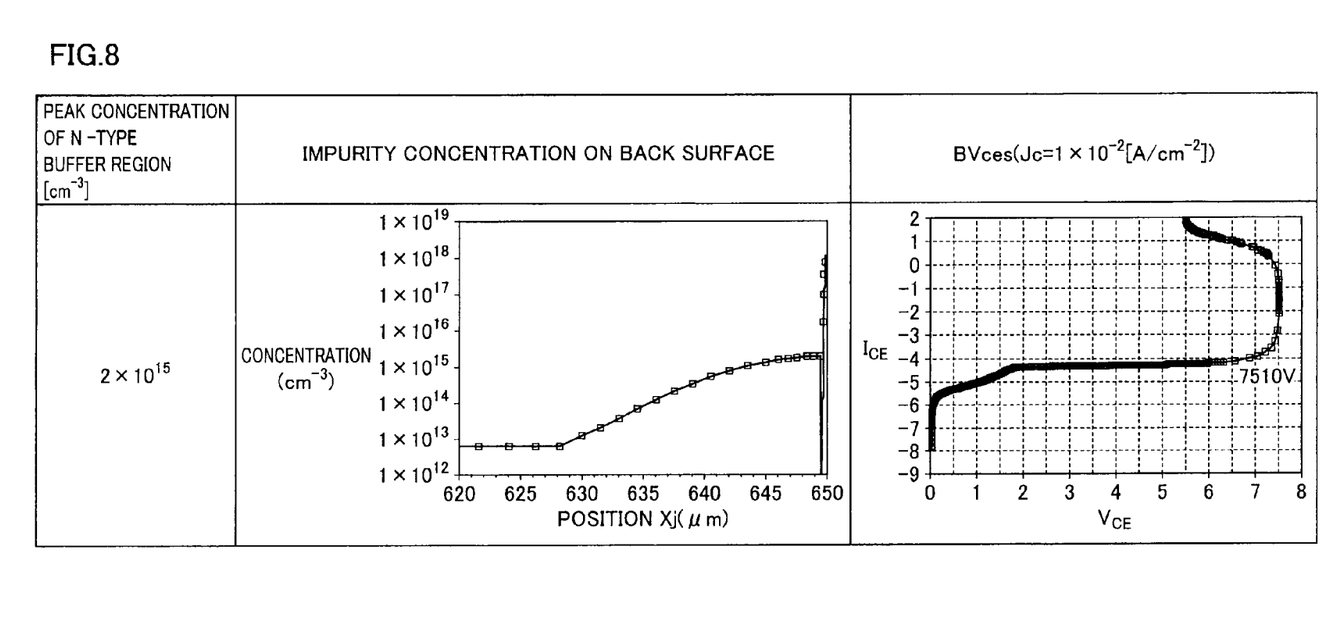
FIG. 8 shows the impurity concentration distribution of the portion along the line II-II in FIG. 1 in a case where the net dose $D_B$ of an n-type buffer region is $2.34 \times 10^{12}/cm^2$ and the relation between $V_{GE}$ and $I_{CE}$ at this time.
Figure 9:
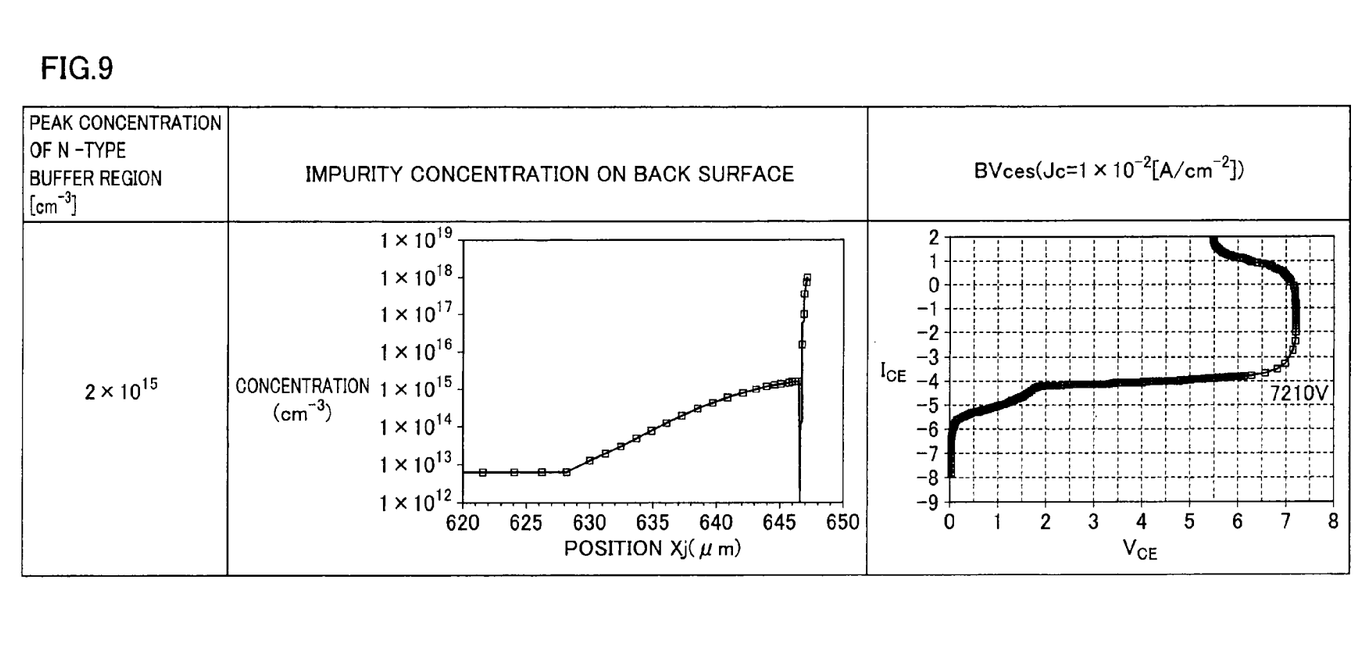
FIG. 9 shows the impurity concentration distribution of the portion along the line II-II in FIG. 1 in a case where the net dose $D_B$ of the n-type buffer region is $1.26 \times 10^{12}/cm^2$ and the relation between $V_{GE}$ and $I_{CE}$ at this time.
Figure 10:
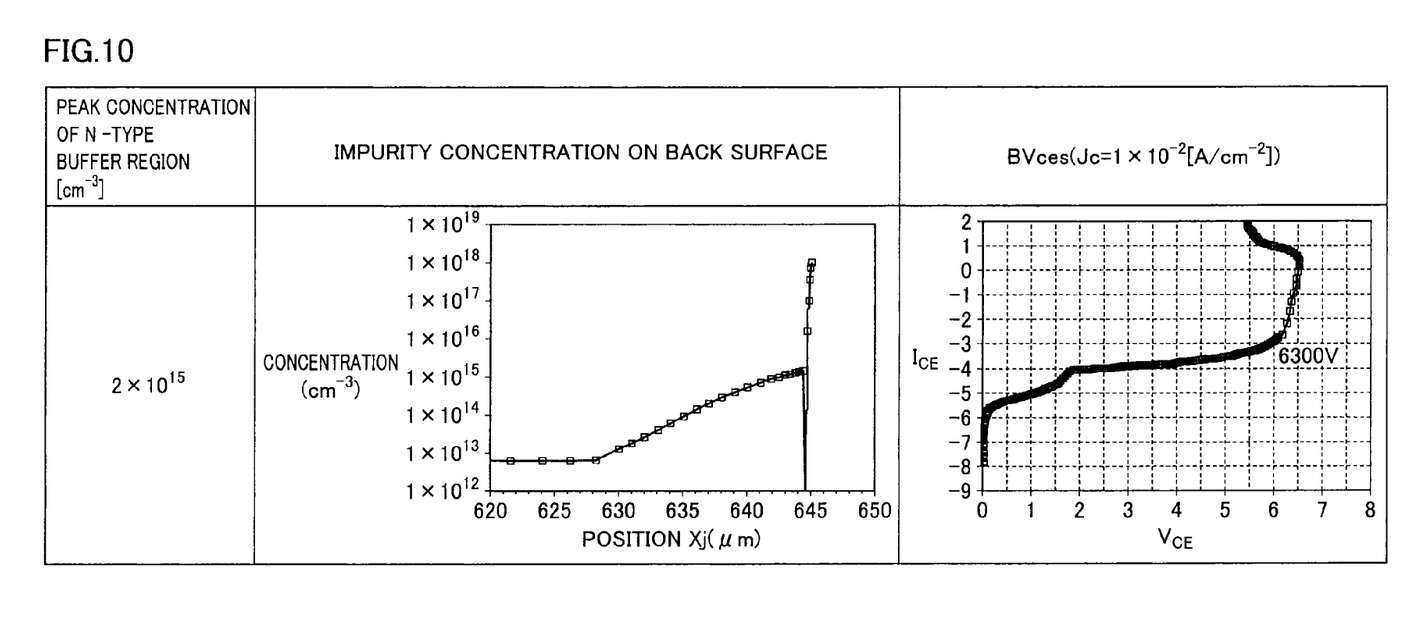
FIG. 10 shows the impurity concentration distribution of the portion along the line II-II in FIG. 1 in a case where the net dose $D_B$ of the n-type buffer region is $7.37 \times 10^{11}/cm^2$ and the relation between $V_{GE}$ and $I_{CE}$ at this time.

When the avalanche voltage is 8000 V, the aforementioned α is 1.935. The net dose $D_D$ of n⁻ drift region 1 was set to 4.46×10¹¹/cm². FIGS. 8 to 10 show the results of the aforementioned examination.

FIG. 8 shows the impurity concentration distribution of the portion along the line II-II in FIG. 1 in a case where the net dose $D_B$ of n-type buffer region 6 is 2.34×10¹²/cm² and the relation between $V_{GE}$ and $I_{CE}$ at this time. From the results shown in FIG. 8, it has been recognized that a withstand voltage of 7510 V exceeding the rated voltage of 6500 V was obtained when the net dose $D_B$ of n-type buffer region 6 was 2.34×10¹²/cm².

FIG. 9 shows the impurity concentration distribution of the portion along the line II-II in FIG. 1 in a case where the net dose $D_B$ of n-type buffer region 6 is 1.26×10¹²/cm² and the relation between $V_{GE}$ and $I_{CE}$ at this time. From the results shown in FIG. 9, it has been recognized that a withstand voltage of 7210 V exceeding the rated voltage of 6500 V was obtained also when the net dose $D_B$ of n-type buffer region 6 was 1.26×10¹²/cm².

FIG. 10 shows the impurity concentration distribution of the portion along the line II-II in FIG. 1 in a case where the net dose $D_B$ of n-type buffer region 6 is 7.37×10¹¹/cm² and the relation between $V_{GE}$ and $I_{CE}$ at this time. From the results shown in FIG. 10, it has been recognized that the withstand voltage was 6300 V lower than the rated voltage of 6500 V when the net dose $D_B$ of n-type buffer region 6 was 7.37×10¹¹/cm².

Thus, it is understood that a withstand voltage exceeding the rated voltage is obtained when the net dose $D_B$ of n-type buffer region 6 is at least the value (=8.63×10¹¹/cm²) obtained by multiplying the net dose $D_D$ (4.46×10¹¹/cm²) of n⁻ drift region 1 by α (1.935).

According to this embodiment, as hereinabove described, the ratio ($D_C/D_B$) of the net dose $D_C$ of p-type collector region 7 with respect to the net dose $D_B$ of n-type buffer region 6 is so set to at least α that the IGBT is not broken under conditions generally employed at each rated condition but a proper margin of the SCSOA resistance can be ensured. These effects can be attained conceivably for the following reason:

The LPT structure is a technique of reducing the thickness of n⁻ drift region 1 by stopping extension of a depletion layer with n-type buffer region 6. However, n-type buffer region 6 is positioned between n⁻ drift region 1 and p-type collector region 7, and hence injection of holes from p-type collector region 7 is suppressed. Thus, the injection rate of the holes depends on the concentration ratio between n-type buffer region 6 and p-type collector region 7, to also influence the SCSOA resistance.

Figure 11:
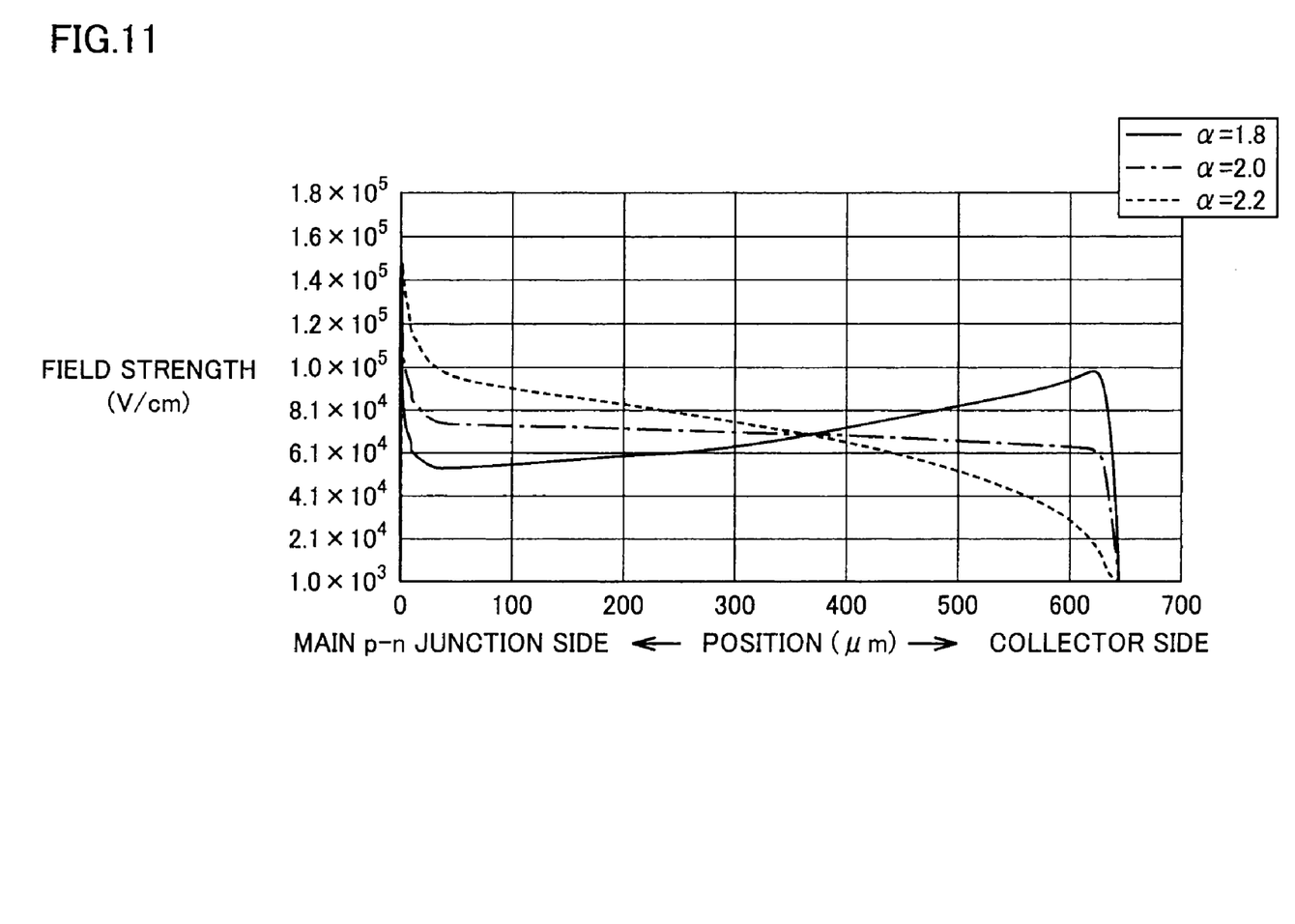
FIG. 11 illustrates the distribution of field strength of the portion along the line II-II in FIG. 1 in an SCSOA of the IGBT having the rated voltage of 6500 V.

Field strength on a collector side depends on α, as shown in FIG. 11. When α is reduced below a constant value, therefore, the field strength on the collector side is increased to exceed the field strength of a main p-n junction (between n⁻ drift region 1 and p-type base region 2) as a result. The p-n junction between p-type collector region 7 and n-type buffer region 6 has lower breakdown strength than the main p-n junction, and hence it is supposed that the SCSOA is broken when designed with a increasing the field strength on the collector side. Thus, it is supposed that a proper margin of the SCSOA resistance can be ensured by properly setting the impurity content ratio ($D_C/D_B$).

According to this embodiment, further, the net dose $D_B$ of n-type buffer region 6 is so set to exceed the value obtained by multiplying the net dose $D_D$ of n⁻ drift region 1 by a that a withstand voltage exceeding the rated voltage can be obtained.

While FIG. 1 shows the IGBT of a planar gate LPT structure, the present invention is not restricted to this but is also applicable to an IGBT having a trench gate LPT structure.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a first conductivity type drift region;
    a first conductivity type emitter region formed on one side of said drift region;
    a second conductivity type base region arranged between said drift region and said emitter region;
    a gate electrode layer arranged to be electrically isolated from and opposed to said base region held between said drift region and said emitter region;
    a second conductivity type collector region formed on another side of said drift region; and
    a first conductivity type buffer region arranged between said drift region and said collector region with a higher impurity concentration than that of said drift region, wherein
    the ratio ($D_C/D_B$) of the net dose $D_C$ of said collector region with respect to the net dose $D_B$ of said buffer region is at least a assuming that a represents the ratio (WTA/WTB) between WTA expressed as:

$$WTA = \sqrt{\frac{2\varepsilon_s \varepsilon_0 V}{qNd}}$$

(where $\varepsilon_S$ represents the dielectric constant of silicon, $\varepsilon_0$ represents the dielectric constant of a vacuum, q represents the charge quantity of electrons, Nd represents the impurity concentration of said drift region and V represents the avalanche voltage) and the thickness WTB of said drift region held between said base region and said buffer region.

2. The semiconductor device according to claim 1, wherein the net dose $D_B$ of said buffer region is at least $D_D \times \alpha$ assuming that $D_D$ represents the net dose of said drift region.

* * * * *